(12) United States Patent
Boateng

(10) Patent No.: US 6,642,701 B2
(45) Date of Patent: Nov. 4, 2003

(54) DEVICE AND METHOD FOR TESTING PHASE-LOCKED LOOPS

(75) Inventor: Kwame Osei Boateng, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 28 days.

(21) Appl. No.: 10/050,863

(22) Filed: Jan. 18, 2002

(65) Prior Publication Data

US 2003/0038619 A1 Feb. 27, 2003

(30) Foreign Application Priority Data

Aug. 23, 2001 (JP) ........................................ 2001-253300

(51) Int. Cl.[7] .............................................. G01R 23/12
(52) U.S. Cl. ................................ 324/76.53; 324/76.52; 331/44; 331/1 A; 331/1 R; 327/157; 714/811; 714/799; 375/376
(58) Field of Search ........................... 331/44, 1 R, 25, 331/1 A; 327/157, 156; 714/811, 799; 375/376, 373–375, 327, 294; 324/76.53, 76.52, 76.55, 76.59, 76.65, 76.68

(56) References Cited

U.S. PATENT DOCUMENTS 5,257,294 A * 10/1993 Pinto et al. ................. 375/376

OTHER PUBLICATIONS

G.A. Van Huben et al., "PLL Modeling and Verification in a Cycle–Simulation Environment", IBM Journal of Research & Development, vol. 43, No. 5/6, 1999. No month available.

Steven L. Maddy, "Phase–Locked Loop", Chapter 70 of the Electrical Handbook Editor–in–Chief: Richard C. Dorf, IEEE Press, CRC Press, pp. 1567–1575, 1993. No month available.

M. Dalmia et al., "Power Supply Current Monitoring Techniques for Testing PLLs", Proc. Sixth IEEE Asian Test Symposium, pp. 366–371, Nov. 1997.

S. Kim, et al., "An Effective Defect–Oriented BIST Architecture for High–Speed Phase–Locked Loops", Proc. 18th IEEE VLST Test Symposium, Apr. 2000.

* cited by examiner

Primary Examiner—N. Le
Assistant Examiner—Vincent Q. Nguyen
(74) Attorney, Agent, or Firm—Staas & Halsey

(57) ABSTRACT

A phase-locked loop (PLL) is tested based on a divide-and-conquer strategy. First, digital components in the PLL are isolated from analog components and tested. Next, the digital components are connected to the analog components and the PLL is exercised by causing it to undergo a series of frequency transitions.

4 Claims, 9 Drawing Sheets

| DT | FB | CK | t=A | S | UP | DN | X | L |
|----|----|----|-----|---|----|----|---|---|
| 1 | x | 0 | 0 | 0 | 1 | · | · | 0 | 1 |
| 1 | x | 0 | 1 | 1 | 1 | 1 | 0 | 1 | 0 |
| 1 | x | 1 | 0 | 1 | 1 | 1 | 1 | 0 | 0 |
| 1 | x | 0 | 0 | 0 | 1 | 1 | 1 | 0 | 1 |
| 1 | x | 1 | 0 | 1 | 1 | 0 | 1 | 0 | 0 |
| 1 | x | 0 | 1 | 0 | 0 | 1 | 1 | 0 | 0 |
| 1 | x | 1 | 1 | 1 | 0 | 1 | 1 | 1 | 1 | x: don't care

FIG. 8

PRIOR ART

DEVICE AND METHOD FOR TESTING PHASE-LOCKED LOOPS

BACKGROUND OF THE INVENTION

1. Field of the Invention

The present invention relates to a device for testing a phase-locked loop (PLL) and a method thereof.

2. Description of the Related Art

The PLL is indispensable in complex high-frequency synchronous systems because of the difficulty in the distribution of reliable low-skew high-frequency clock signal throughout the various package technologies of a complex system.

The benefits of utilizing PLL-based clock distribution for high-frequency synchronous systems is particularly clear in the design of a complex high-performance machine such as a server. A high-frequency synchronous system employs a variety of packaging technologies, including single-chip modules (SCMs), multichip modules (MCMs), cards, and boards. The distribution of a reliable low-skew high-frequency clock signal throughout these various package technologies is, to say the least, difficult. The PLL-based design facilitates distribution of a relatively low-frequency reference oscillator to each of the components. Each component contains a PLL, which then multiplies that frequency to a higher frequency that it requires while maintaining proper phase alignment for a synchronous design. The ability of the PLL to multiply the reference oscillator frequency is critical, Far since the synchronous system may have a number of components running at different frequencies (G. A. Van Huben, T. G. McNamara and T. E. Gilbert, "PLL modeling and verification in a cycle-simulation environment," IBM Journal of Research & Development, Vol. 43, No. 5/6, 1999).

Another advantage of the PLL-based design concept is that it permits the use of programmable ratios among a collection of system components. Assume a subsystem is supposed to run at a specified number of times slower than another, say a processor. If the chips of the subsystem were actually to run faster or slower than the specified frequency, the multiplier bits of the subsystem PLL could be reprogrammed with a new "gear ratio." As long as the on-chip clock logic is capable of supporting a different frequency, the system ratios can be reprogrammed without the risk of introducing frequency-sensitive anomalies into the rest of the system. It is critical to keep the clock skew between the various components of a synchronous system very low. The PLL for each component phase-aligns its on-chip clock distribution delay. PLLs are also used in frequency synthesizers, analog and digital modulators and demodulators.

A PLL is described as a system that uses feedback to maintain an output signal in a specific phase relationship with a reference signal in the following reference.

Steven L. Maddy, "Phase-Locked Loop," Chapter 70 of *The Electrical Engineering Handbook*, editor-in-chief: Richard C. Dorf, IEEE Press, CRC Press, pp. 1567–1575, 1993.

FIG. 1 shows a configuration of such a PLL. As explained above, the frequency of the output signal of the PLL is a multiple of the frequency of its input signal.

Phase comparator 11 produces an output combination that is dependent on the phase difference of the two input signals CK and FB, where CK is the reference signal input. It is a state-machine triggered by the rising edges of the input signals CK and FB and produces the output signals UP and DN. The state diagram is as shown in FIG. 2. As illustrated in FIG. 2, the state-machine has a discharge state 21, a hold state 22 and a charge state 23. Lock detector 16 produces a single observable output signal L that is dependent on the phase difference of the two input signals.

Charge pump 12 consists of two CMOS (complementary metal-oxide semiconductor) switches, as illustrated in FIG. 3, controlled by the states of the phase comparator 11. FIG. 4 shows how the charge pump 12 functions. When the signal UP is low (logic 0), the switch 31 connects the node of output signal $V_{out}$ to $V_{DD}$, and when the signal DN is low, the switch 32 connects the node to $V_{SS}$. When both signals UP and DN are high (logic 1), the node is isolated from $V_{DD}$ and $V_{SS}$ and voltage $V_{op}$ on a capacitor of loop filter (LPF) 13 appears as $V_{out}$.

The loop filter 13 is a low-pass filter and is used to control the PLL dynamics and therefore the performance of the PLL. Voltage-controlled oscillator (VCO) 14 is a circuit that produces an AC (alternating current) output whose frequency $F_{vco}$ is proportional to the input control voltage. 1/N divider 17 is a device that produces output signal $D_{out}$ whose frequency is an integer (denoted by N) division of that of an input signal (output signal X of the PLL). When the frequency of the signal X is $F_{vco}$, the frequency of the signal $D_{out}$ becomes $F_{vco}/N$. The signal $D_{out}$ is input as the signal FB to the phase comparator 11.

2-to-1 multiplexer (MUX) 15 makes it possible to by-pass the PLL with a clock signal at input A. S is the control input for the multiplexer 15. The PLL can be by-passed by setting input S to 0 and clocking through input A. A zero-pulse (pulse width given in specification) on S resets the PLL to a hold state.

The above description of PLL functions suggests that PLL testing may be achieved by exercising the PLL under test (PUT) as follows.

Checking the "start" sequence: This is the verification that the PLL could be brought up to frequency within a specified time from the time the system is started. This includes the verification of phase locking.

Normal mode operation: After phase lock, checks must be done to ascertain that the output signal of the PLL is at the desired frequency.

Changing frequency dynamically: This is the verification of the fact that the PLL could operate in various modes, such as system test mode, normal operation mode, etc. This may involve the reprogramming of the PLL in order to effect frequency change dynamically.

Checking the "stop" sequence: This is the verification that all chips being driven would stop at the stop of the PLL. This, together with the "start" sequence check, verifies that the driven chips would cease and resume operation in tandem.

However, the PLL, like other high-frequency analog and mixed signal circuits, is difficult to test. Although most specification-based test schemes for the PLL perform the "start" sequence checks and normal mode operation verification, dynamic change of frequency and "stop" sequence checks are not facilitated for.

Dalmia et al. have presented an operating current-monitoring method of PLL testing (M. Dalmia, A. Ivanov and S. Tabatabaei, "Power Supply Current Monitoring Techniques for Testing PLLs," *Proc. Sixth IEEE Asian Test Symposium*, pp. 366–371, November 1997). The approach used in this method is not ad-hoc, however, currently it is difficult to implement a test scheme based on operating current measurement. Kim et al. have presented a defect-oriented method that realizes testing by taking the PLL operation through two dynamic transitions (S. Kim, M. Soma and D. Risbud, "An Effective Defect-Oriented BIST Architecture for High-Speed Phase-Locked Loops, *"Proc. 18th IEEE VLSI Test Symposium,* April 2000). The method then measures the three stable frequencies for comparisons with the expected frequencies. However, their method does not perform the "start" sequence check and it requires the addition of a significant amount of extra hardware.

SUMMARY OF THE INVENTION

It is an object of the present invention to provide a device for modified PLL testing which includes verification of dynamic change of frequency and/or a "start" sequence check, and a method thereof.

The testing device according to the present invention comprises a reset circuit, an input circuit, an output circuit and a connection control circuit.

The reset circuit resets the phase-locked loop by disconnecting the charge pump from the loop filter and providing an alternative discharge path for the loop filter. The input circuit receives a feedback signal from an output of the phase-locked loop and a control signal, produces a combination signal from the received signals and inputs the combination signal to the phase-locked loop. The combination signal, together with a reference signal, causes the phase-locked loop to perform one of charging up the loop filter, discharging the loop filter and a normal operation. The output circuit outputs a signal with a frequency corresponding to an output of the voltage-controlled oscillator in cases that the phase-locked loop charges up the loop filter, that the phase-locked loop discharges the loop filter and that the phase-locked loop performs the normal operation. The connection control circuit controls connection between a digital circuit and an analog circuit of the phase-locked loop.

BRIEF DESCRIPTION OF THE DRAWINGS

FIG. 8 shows test patterns for digital components; and

DESCRIPTION OF THE PREFERRED EMBODIMENTS

The embodiments of the present invention are described below in detail by referring to the attached drawings.

Figure 5:
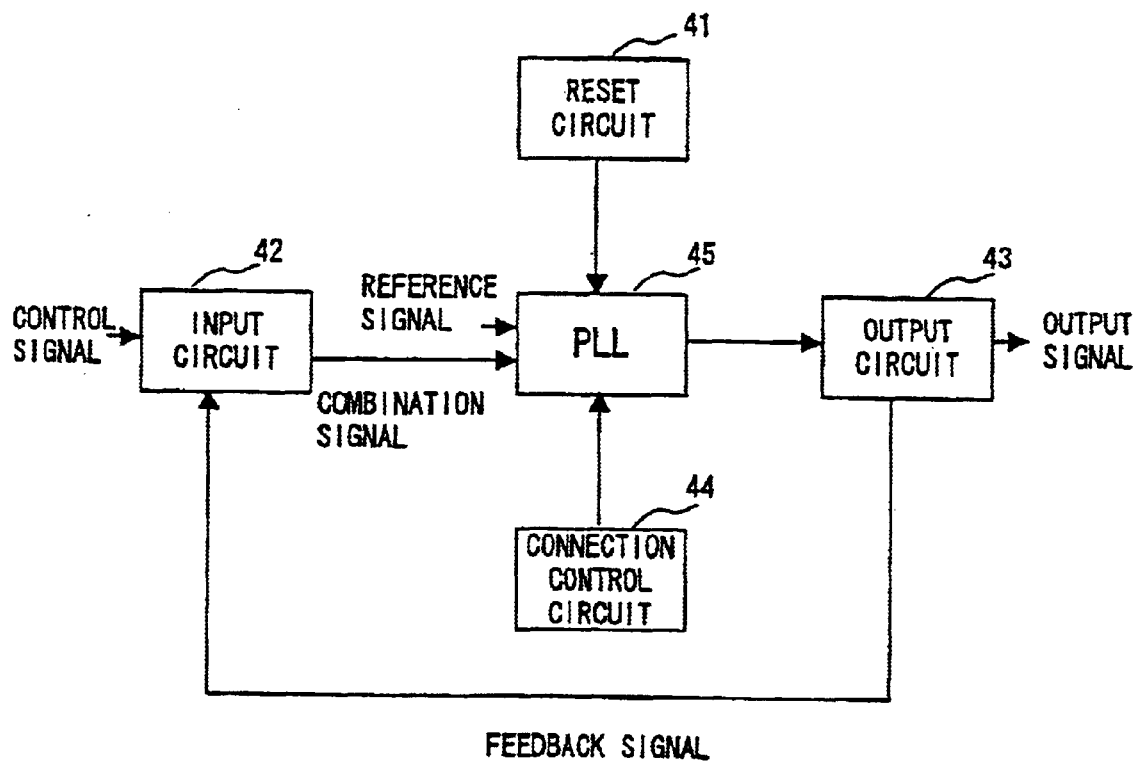
FIG. 5 shows a principle of a testing device according to the present invention.

FIG. 5 shows the principle of a testing device according to the present invention. The testing device comprises reset circuit 41, input circuit 42, output circuit 43 and connection control circuit 44.

The reset circuit 41 resets PLL 45 by disconnecting the charge pump from the LPF and providing an alternative discharge path for the LPF. The input circuit 42 receives a feedback signal from an output of the PLL 45 and a control signal, produces a combination signal from the received signals and inputs the combination signal to the PLL 45. The combination signal, together with a reference signal, causes the PLL 45 to perform one of charging up the LPF, discharging the LPF and a normal operation. The output circuit 43 outputs a signal with a frequency corresponding to an output of the VCO in cases that the PLL 45 is reset, when the PLL 45 charges up the LPF, that the PLL 45 discharges the LPF and that the PLL 45 performs the normal operation. The connection control circuit 44 controls connection between a digital circuit and an analog circuit of the PLL 45.

Disconnecting the charge pump from the LPF and providing the alternative discharge path for the LPF, the reset circuit 41 discharges the LPF for a period determined by the width of the reset pulse (a duration equal to the width). Using the input circuit 42, the feedback signal and the control signal are input to the PLL 45 and the PLL 45 can be exercised by transitions through various stable states, which include a charged-up state, a partially discharged state, a fully discharged state and a state of the normal operation. Since the frequency of the output signal from the output circuit 43 corresponds to that of the output signal of the VCO, pass/fail decision can be made by measuring the frequency at each of the states. The connection control circuit 44 isolates the digital circuit from the analog circuit or connects the digital circuit and the analog circuit according to need. Thus, the digital circuit can be tested separately from the analog circuit.

Thus, the PLL 45 can be exercised well enough without making the output of the phase comparator directly controllable and a modified PLL testing is realized.

Figure 7:
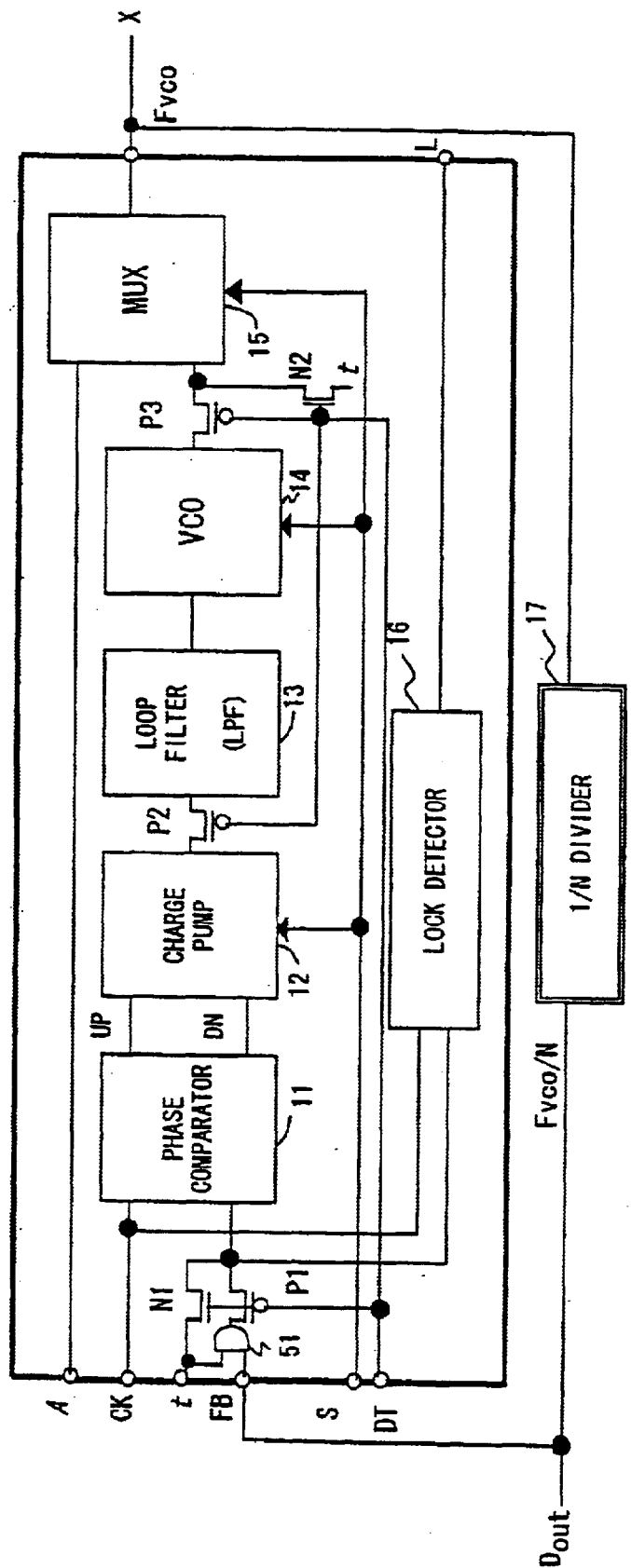
FIG. 7 shows a configuration of PLL testing.

The reset circuit 41 shown in FIG. 5 corresponds to a signal S and reset interfaces to the charge pump 12 and VCO 14 shown in FIG. 7, for example. The input circuit 42 shown in FIG. 5 corresponds to AND gate 51 and switches N1 and P1 shown in FIG. 7, and the output circuit 43 shown in FIG. 5 corresponds to MUX 15 and 1/N divider 17 shown in FIG. 7, for example. The connection control circuit 44 shown in FIG. 5 corresponds to the transistor switches P2, P3 and N2 shown in FIG. 7, for example. The reference signal shown in FIG. 5 corresponds to signal CK shown in FIG. 7, the combination signal shown in FIG. 5 corresponds to a signal input to lower inputs of phase comparator 11 and lock detector 16 shown in FIG. 7, and the output signal from the output circuit 43 shown in FIG. 5 corresponds to a signal at X or $D_{out}$ shown in FIG. 7, for example.

The testing method of the present invention is a systematic method which has all the advantages of the methods of Dalmia et al. and Kim et al. mentioned earlier. It gives a clear description of test generation and performs the "start" sequence check, as well. In addition, the method of the invention has the following features.

1. The method employs a 'divide-and-conquer' strategy.
2. It has an easy-to-understand procedure for test pattern generation.
3. It involves voltage testing with output observations of logic values or frequency measurements (in the case when VCO is active).
4. It incorporates a quiescent power supply current (IDDQ) test for the digital units of the PLL.

Figure 1:
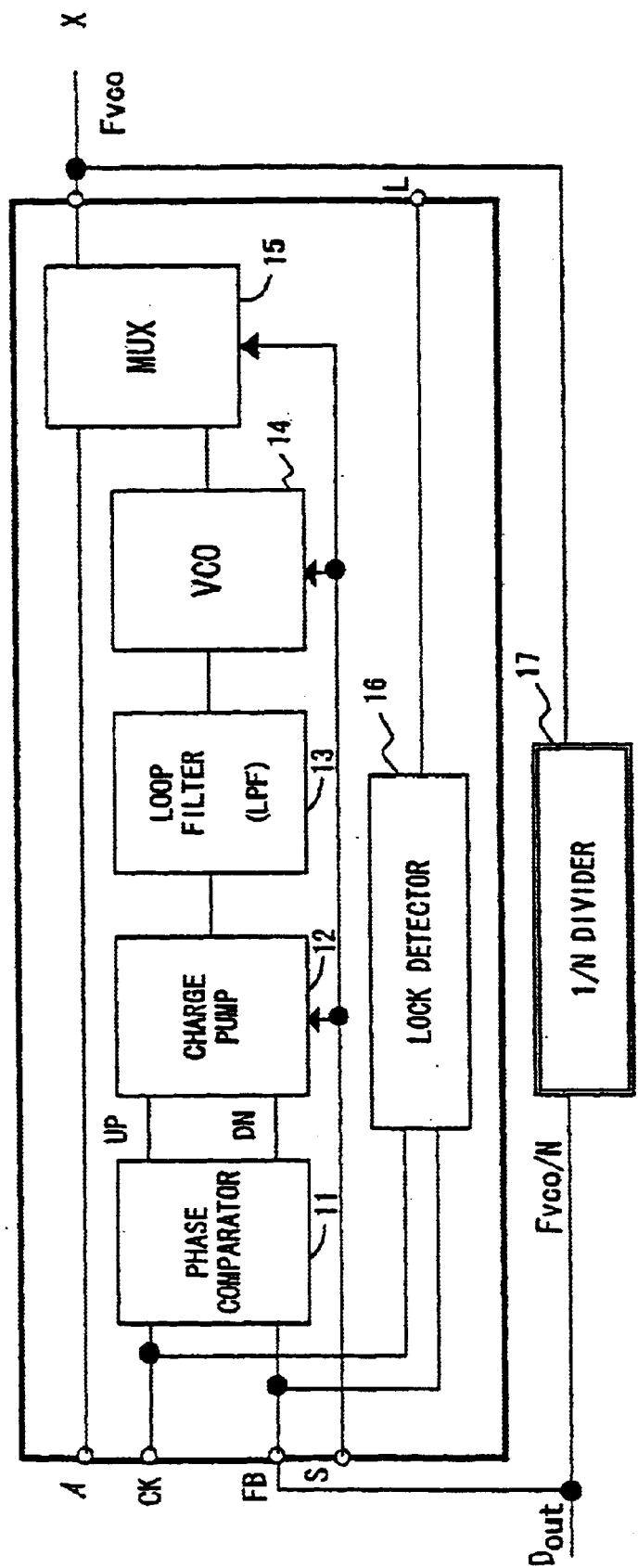
FIG. 1 shows a configuration of a conventional PLL.
Figure 2:
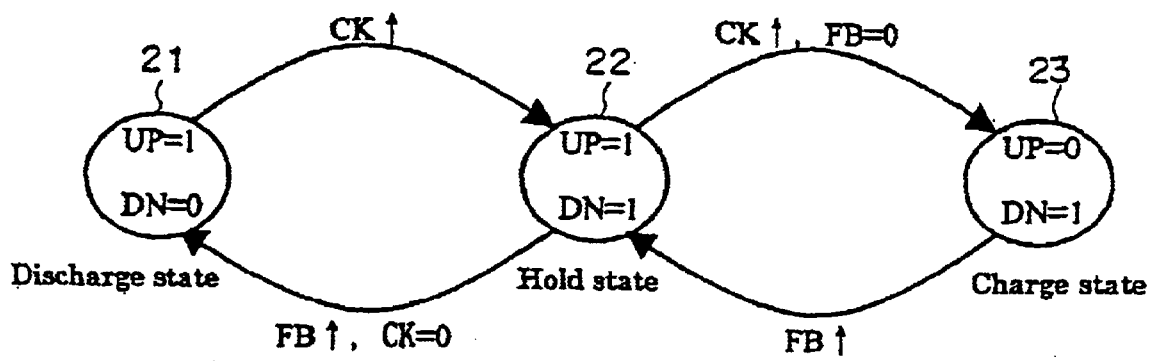
FIG. 2 is a state diagram for a phase comparator.
Figure 3:
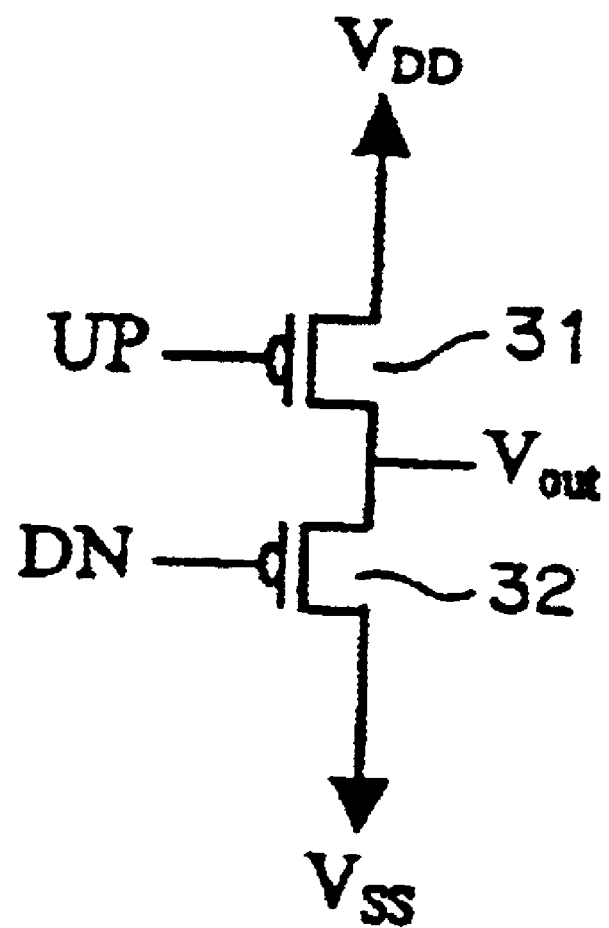
FIG. 3 shows a configuration of a charge pump.
Figure 4:
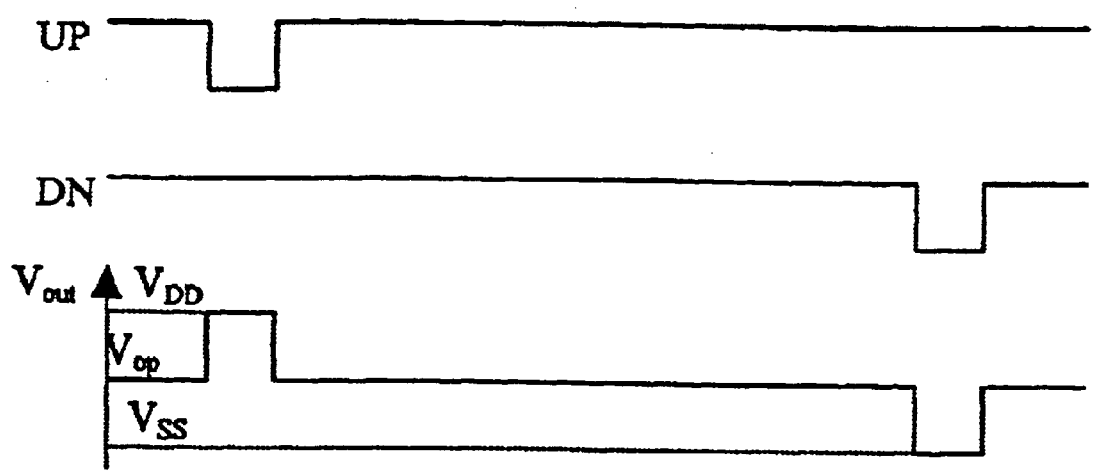
FIG. 4 shows functions of a charge pump.
Figure 6:
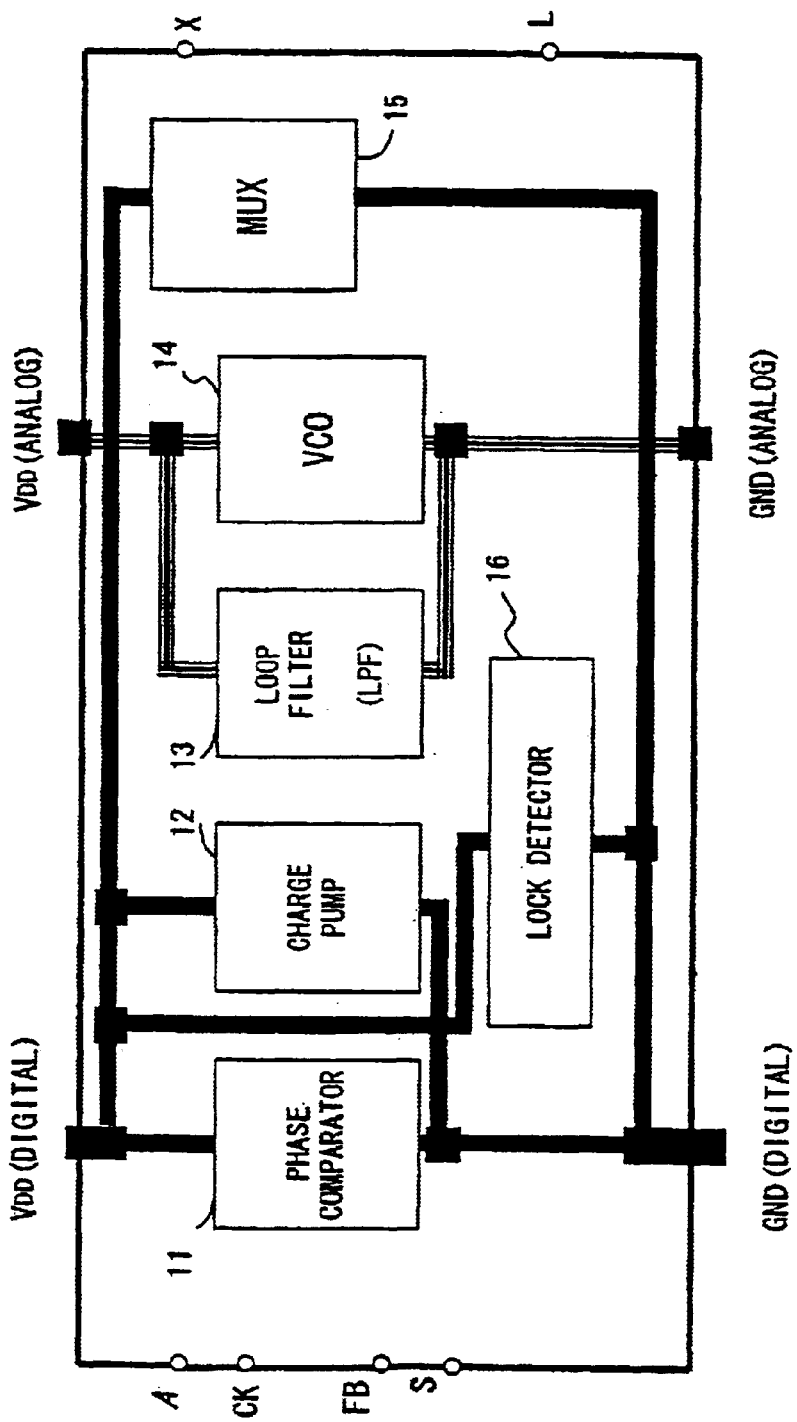
FIG. 6 shows a layout of power supplies for a PLL.

FIG. 6 shows the layout of the power supply for the PLL shown in FIG. 1. In FIG. 6, the separation of the power supply of the digital units (digital circuit) from the power supply of the analog units (analog circuit) is evident. This makes feasible the idea of isolating the digital units from the analog units during test. A two-phase approach is adopted for the testing of the PLL. In the first phase (Phase 1), only the digital components are tested. In this phase, the digital components (phase comparator 11, charge pump 12, MUX 15 and lock detector 16) of PUT are isolated from the analog components (LPF 13 and VCO 14), and then IDDQ and voltage tests are simultaneously conducted on them.

Since the LPF 13 controls the performance of the PLL (and the effect of the LPF 13 is controllable), varying the amount of charge stored on the capacitor of the LPF 13 (i.e. charging and discharging the capacitor) and allowing enough time to take measurements, provides a means of exercising the PLL while observing its response. In the second phase (Phase 2), the digital units are connected to the analog units and PUT is exercised by causing it to undergo a series of frequency transitions. By manipulating the input signals CK and FB, it is possible to shift the operating point of the VCO 14 through the frequencies $F_{max}$, $F_o$ and $F_{min}$; corresponding to VCO input voltages $v=V_{max}$, $v=(V_{max}+V_{min})/2$ and v equals near-ground voltage. Here, $V_{max}$ and $V_{min}$ are the maximum and minimum voltages input to the VCO 14, respectively (see FIG. 9).

The PLL is exercised by transition through four operating points corresponding to $F_{max}$, $F_o$, $F_{min}$ and the normal operating frequency, $F_{op}$. $F_{max}$, $F_o$, $F_{min}$ and $F_{op}$ represent a maximum reference frequency, a center frequency, a minimum reference frequency and an expected normal operating frequency, respectively. At each operating point, a frequency measurement is taken after time intervals determined through transient analysis of the circuit. The measured values are compared against the good machine values to determine whether or not the PUT is fault-free within pre-computed tolerance limits. Determination of the good machine values and the tolerances on them is achieved through the analysis of reference values used in specification-based testing and through simulation.

Figure 9:
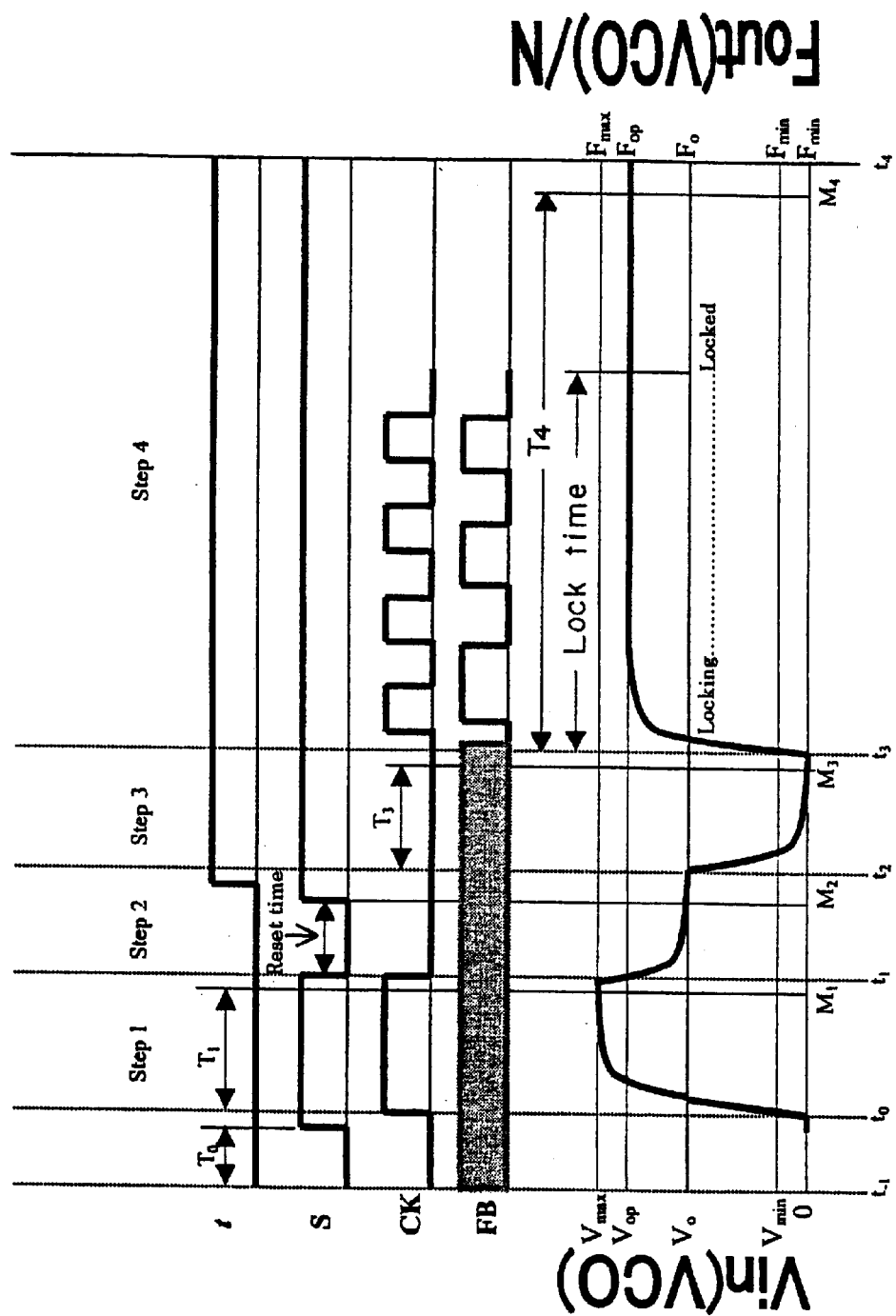
FIG. 9 is a timing chart of exercising and testing a PLL.

Next, an example of PLL testing is explained by referring to FIGS. 7 through 9.

FIG. 7 shows the configuration of a testing device. The reset interfaces are actually included in the charge pump 12 and VCO 14. The LPF 13 is normally discharged through the lower transistor of the charge pump. However, during reset an alternative discharge path is provided in the reset interface to the charge pump 12 (partial discharge). The LPF 13 is basically an RC (resistor-capacitor) circuit, and the discharge curve is of the form $v=V_{max}(1-\exp(-t/CR))$. Thus when CR is known, the time (the value of t in the equation) it takes to discharge the LPF 13 to a given voltage can be computed. The width of the reset pulse is made equal to this time.

To facilitate the manipulation of the feedback input of the phase comparator 11, controllability has been introduced at the input of the phase comparator 11 (and hence of the lock detector 16). Two transistor switches N1 and P1 and AND gate 51 provide the controllability. The signals DT and t provide the controls. The AND gate 51 receives the signal t and feedback signal FB from the output of the PLL and produces a logical product of them. The switch N1 connects t to the lower inputs of the phase comparator 11 and the lock detector 16 when DT=1 and the switch P1 connects the output of the AND gate 51 to the lower inputs when DT=0.

Also, three transistor switches P2, P3 and N2 have been inserted to provide a means for partitioning the PLL into digital and analog sub-circuits in Phase 1. Digital sub-circuit isolation is controlled by the digital test signal DT. The switch P2 connects the output of the charge pump 12 to the input of the LPF 13 when DT=0, and the switch P3 connects the output of the VCO 14 to the lower input of the MUX 15 when DT=0. The switch N2 connects t to the lower input of the MUX 15 when DT=1. DT=0 and t=1 during normal operation of the PLL and DT=1 when the digital sub-circuit is to be isolated and tested separately. In this method, it is assumed that the 1/N divider 17 has been separately tested and found to be free of faults that might invalidate this testing.

In the testing of digital circuits for functional or logic faults in Phase 1, it is necessary that, after the application of test patterns, the circuit gets stable before the outputs are observed (or IDDQ observed) Particularly, IDDQ testing cannot be carried out if even one gate is undergoing a transition during the time of observation. To ensure that the necessary stable conditions exist for testing the digital components, the signal DT must be set to logic 1.

To begin testing the digital components, first, DT is set to logic 1. FIG. 8 shows the test patterns for testing the digital components. As can be seen from FIG. 7, DT=1 isolates the digital components of PUT and connects the lower inputs of the phase comparator 11, the lock detector 16 and the MUX 15 to t. The columns X and L give the logic values expected at the outputs of the MUX 15 and the lock detector 16, respectively. Under the single stuck-at fault model, the MUX 15 is completely tested. In the case of the lock detector 16 and the phase comparator 11, all input permutations of logic values are applied and hence their functions are completely verified. Particularly, the appropriate sequence of input patterns has been chosen to ensure that the state machine is functionally verified. Even though UP and DN are not primary inputs, their value are shown to provide evidence that the charge pump is adequately tested (IDDQ).

There are four steps in Phase 2 corresponding to the stages of the diagram shown in FIG. 9. In Phase 2, the entire PUT is exercised together and frequency measurements are taken. Initially, the signal DT is set to logic 0 and the signal S is set to logic 0 long enough to ensure that the capacitor of the LPF 13 is at ground potential. In FIG. 9, $V_{in}$ (VCO) represents the input voltage v of the VCO 14 and $F_{out}$(VCO)/N represents the output frequency at $D_{out}$. In this case, $D_{out}$ is the target signal for frequency measurement. The testing procedure in each of the steps 1 through 4 is as follows.

Step 1 (stage between time $t_{-1}$ and $t_1$) : Set t=CK=0. After time $T_0$, set S to 1 and then change the value of CK to 1. Wait for $T_1$ time units after the transition at CK and then, measure frequency $F_1$ at $D_{out}$ at time $M_1$ (for the fault-free PLL $F_1=F_{max}$). $T_1$ is the time it takes for the LPF capacitor to charge from ground voltage (0) up to $V_{max}$.

Step 2 (stage between time $t_1$ and $t_2$) : Set CK back to 0 and reset PUT to discharge the LPF capacitor until the input voltage of the VCO 14 is $V_0=(V_{max}+V_{min})/2$. The time for achieving this partial discharge must be pre-computed. Immediately after the reset, measure $F_2$ at $D_{out}$ at time $M_2$ (for the fault-free PLL $F_2=F_0$). After measurement, set t to 1.

Step 3 (stage between time $t_2$ and $t_3$) : With CK still at logic 0, the first positive transition from FB causes the beginning of the complete discharge of The LPF capacitor. After time $T_3$ from the last transition at t, measure $F_3$ (expected to be equal to $F_{min}$) at $D_{out}$ at time $M_3$. $T_3=2/F_0+\tau$; where $\tau$ is the time for complete discharge of the LPF capacitor.

Step 4 (stage between time $t_3$ and $t_4$): Input operating clock signal at CK while maintaining t at logic 1 to allow the feedback clock signal to pass from FB. After time period $T_4$ ($T_4 \geq$ lock time+$1/F_{op}$), observe the value of L to ascertain a locked situation. Then, measure $F_4$ (expected to be equal to $F_{op}$) at $D_{out}$ at time $M_4$. This step corresponds to a "start" sequence check (ascertaining locked condition by observing the output of the lock detector 16 after a specified time) and a normal mode operation verification (verifying the normal mode output frequency).

For a given PLL (specified technology), the good machine values of (and tolerances on) the reference frequencies $F_{max}$, $F_o$, $F_{min}$ and $F_{op}$ are set through simulations and from design specifications. If all measured quantities are within the tolerance range of their good machine values, PUT has 'passed' the test. Otherwise PUT has 'failed'. The frequencies may be also measured at X instead of $D_{out}$ if an appropriate measurement is applicable there.

As explained in detail above, a divide-and-conquer approach has been applied to develop a systematic method for testing PLLs. First, the digital components are isolated and both voltage (logic) and IDDQ test is conducted on them. Next, the entire PLL is exercised by performing a series of charging and discharging of the LPF capacitor. In this process, the method performs "start" sequence check, normal mode operation verification, checks dynamic frequency change and performs "stop" sequence check.

This systematic method of testing the PLL has been achieved by adding two extra primary inputs, five transistors and one 2-input gate.

According to the present invention, modified PLL testing, which includes verification of dynamic change of frequency and/or a "start" sequence check, is realized with simple hardware.

What is claimed is:

1. A testing device for a phase-locked loop including a phase comparator, a charge pump, a loop filter and a voltage-controlled oscillator, comprising:

a reset circuit resetting the phase-locked loop by disconnecting the charge pump from the loop filter and providing an alternative discharge path for the loop filter;

an input circuit receiving a feedback signal from an output of the phase-locked loop and a control signal, producing a combination signal from the received signals and inputting the combination signal to the phase-locked loop, the combination signal, together with a reference signal, causing the phase-locked loop to perform one of charging up the loop filter, discharging the loop filter and a normal operation;

an output circuit outputting a signal with a frequency corresponding to an output of the voltage-controlled oscillator in cases that the phase-locked loop charges up the loop filter, that the phase-locked loop discharges the loop filter and that the phase-locked loop performs the normal operation; and a connection control circuit controlling connection between a digital circuit and an analog circuit of the phase-locked loop.

2. The testing device according to claim 1, wherein:

the digital circuit includes the phase comparator and the charge pump, and the analog circuit includes the loop filter and the voltage-controlled oscillator;

said connection control circuit isolates the digital circuit from the analog circuit when the digital circuit is tested; and when the digital circuit is not isolated from the analog circuit, the combination signal, together with the reference signal, causes the phase-locked loop to perform one of charging up the loop filter, discharging the loop filter and the normal operation.

3. The testing device according to claim 1, wherein:

said input circuit inputs the combination signal to the phase comparator; and the phase comparator produces input signals for the charge pump according to the combination signal.

4. A testing device for a phase-locked loop including a phase comparator, a charge pump, a loop filter and a voltage-controlled oscillator, comprising:

reset means for resetting the phase-locked loop by disconnecting the charge pump from the loop filter and providing an alternative discharge path for the loop filter;

input means for receiving a feedback signal from an output of the phase-locked loop and a control signal, producing a combination signal from the received signals and inputting the combination signal to the phase-locked loop, the combination signal, together with a reference signal, causing the phase-locked loop to perform one of charging up the loop filter, discharging the loop filter and a normal operation;

output means for outputting a signal with a frequency corresponding to an output of the voltage-controlled oscillator in cases that the phase-locked loop charges up the loop filter, that the phase-locked loop discharges the loop filter and that the phase-locked loop performs the normal operation; and connection control means for controlling connection between a digital circuit and an analog circuit of the phase-locked loop.

* * * * *